(12) United States Patent
Lee

(10) Patent No.: US 6,599,806 B2
(45) Date of Patent: *Jul. 29, 2003

(54) METHOD FOR MANUFACTURING A CAPACITOR OF A SEMICONDUCTOR DEVICE

(75) Inventor: Byoung-taek Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/863,729

(22) Filed: May 22, 2001

(65) Prior Publication Data

US 2001/0025976 A1 Oct. 4, 2001

Related U.S. Application Data

(62) Division of application No. 09/245,777, filed on Feb. 5, 1999, now Pat. No. 6,239,461.

(30) Foreign Application Priority Data

Oct. 16, 1998 (KR) ........................................ 1998-43354

(51) Int. Cl.⁷ .............................................. H01L 21/20
(52) U.S. Cl. ........................ 438/396; 438/399; 438/240
(58) Field of Search ................................ 438/396, 398, 438/399, 240, 253, 255, 3

(56) References Cited

U.S. PATENT DOCUMENTS

| | | | | |
|---|---|---|---|---|
| 5,392,189 A | | 2/1995 | Fazan et al. ................ | 257/310 |
| 5,701,647 A | * | 12/1997 | Saenger et al. ............ | 29/25.42 |
| 5,786,259 A | * | 7/1998 | Kang .......................... | 438/396 |
| 5,892,254 A | * | 4/1999 | Park et al. .................. | 257/259 |
| 6,001,660 A | * | 12/1999 | Park et al. ...................... | 437/3 |
| 6,130,124 A | * | 10/2000 | Lee ............................. | 438/240 |
| 6,177,351 B1 | * | 1/2001 | Beratan et al. ............ | 438/694 |
| 6,180,974 B1 | * | 1/2002 | Okutoh et al. ............. | 257/306 |

* cited by examiner

Primary Examiner—Michael Trinh
(74) Attorney, Agent, or Firm—Harness, Dickey & Pierce, P.L.C.

(57) ABSTRACT

A method for manufacturing a capacitor for a semiconductor device, the method includes forming a first interlayer dielectric film pattern on a semiconductor substrate, with the interlayer dielectric film pattern having a first contact hole to expose a portion of the semiconductor substrate through the first contact hole. A contact plug is formed to fill the first contact hole and connect to the semiconductor substrate. A diffusion barrier layer pattern is formed on the contact plug, and a first conductive film pattern is formed on the diffusion layer pattern. Next a second interlayer dielectric film pattern is formed on the first dielectric film pattern and the first conductive film pattern. The second interlayer dielectric film pattern includes a second contact hole that exposes a top surface of the first conductive film pattern. A second conductive film pattern is formed on the first conductive film pattern which is exposed through the second conductive film pattern and a third conductive film is formed on the dielectric film.

16 Claims, 5 Drawing Sheets

METHOD FOR MANUFACTURING A CAPACITOR OF A SEMICONDUCTOR DEVICE

CROSS REFERENCE TO RELATED APPLICATION

This application is a division of and claims priority from U.S. patent application Ser. No. 09/245,777, filed Feb. 5, 1999, U.S. Pat. No. 6,239,461 entitled, "Capacitor of Semiconductor Device and Method for Manufacturing the Same." which claims priority from Korean Patent Application Number 98-43354, filed Oct. 16, 1998.

BACKGROUND OF THE INVENTION

1. Field of the Invention

The present invention relates to a semiconductor device and a method for manufacturing the same, and more particularly, to a capacitor of a semiconductor device including a dielectric film of high dielectric constant (a high dielectric film) and a method for manufacturing the same.

2. Description of the Related Art

As an integration density of a semiconductor device such as a dynamic random access memory (DRAM) and a ferro-electric RAM (FRAM) increases, a high dielectric constant material such as $PbZrTiO_3$ (PZT) or $BaSrTiO_3$ (BST) is required for the dielectric film of a capacitor. Metals of the platinum group and the oxides thereof are mainly used for the conductive film forming a lower electrode or an upper electrode in a capacitor using the high dielectric film. Here, a dry etching for patterning the platinum group metals and the oxide thereof used for the conductive film of the capacitor is difficult. Also, since the platinum group and the oxide thereof reacts with a polysilicon film used as a contact plug, a diffusion barrier layer for preventing the reaction is required between the conductive film and the polysilicon film.

FIG. 1 is a sectional view for describing the capacitor of the semiconductor device according to a conventional technology.

To be specific, an interlayer dielectric film 3 having a contact hole is formed on a semiconductor substrate 1. A contact plug 5 comprised of the polysilicon film is buried in the contact hole. A diffusion barrier layer 7 connected to the contact plug 5 and comprised of Ta is formed. A first conductive film 9 used as the lower electrode of the capacitor and comprised of Pt is formed on the diffusion barrier layer 7. A high dielectric film 11 is formed on the overall surface of the semiconductor substrate 1 on which the first conductive material 9 is formed. A second conductive material 13 used as an upper electrode is formed on the overall surface of the semiconductor substrate 1 on which the high dielectric film 11 is formed.

In a conventional capacitor shown in FIG. 1, the diffusion barrier layer 7 is formed in order to prevent the reaction between the platinum film of the first conductive film 9 and the contact plug 5. In the conventional capacitor shown in FIG. 1, since the side surfaces of the platinum film of the first conductive film 9 and the diffusion barrier layer 7 are exposed during the deposition of the dielectric film 11 and in a subsequent heat treatment process, the diffusion barrier layer 7 is oxidized and thus becoming $Ta_2O_5$ which is a non-conductor. Accordingly, the contact resistance the conductive film 9 increases and the first film conductive film 9 cannot be used. Also, in the conventional capacitor shown in FIG. 1, leakage current increases since the diffusion barrier layer 7 reacts with the high dielectric film 11.

A method of recessing the contact plug is proposed in order to solve the above problem, which is described with reference to FIGS. 2 and 3.

FIGS. 2 and 3 are sectional views showing the capacitors of the semiconductor device according to another conventional technology.

Referring to FIGS. 2 and 3, an interlayer dielectric film 23 having a contact hole is formed on a semiconductor substrate 21. A silicon plug 25 and a diffusion barrier layer 27 comprised of Ta film are sequentially buried in the contact hole. A first conductive film 29 used as the lower electrode of the capacitor and comprised of Pt film is formed on the diffusion barrier layer 27.

In the conventional capacitor shown in FIG. 2, the diffusion barrier layer 27 is formed in a position different from that of the diffusion barrier layer 7 of FIG. 1. Namely, since the diffusion barrier layer 27 is buried in the contact hole, it is possible to prevent the side surface of the diffusion barrier layer 27 from being exposed.

However, in the conventional capacitor shown in FIG. 2, the diffusion path of an oxygen atom is short, and thus the diffusion barrier layer 27 may be oxidized during a subsequent process of forming the high dielectric film.

Furthermore, as shown in FIG. 3, when a misalignment occurs during patterning for forming the first conductive film 29, the diffusion barrier layer 27 is exposed and oxidized during the subsequent profess of depositing the high dielectric film and becomes a nonconductor. When the diffusion barrier layer 27 becomes nonconductive, the contact resistance of the conductive film 29 is increased and the production yield of the semiconductor device is deteriorated.

SUMMARY OF THE INVENTION

In accordance with the present invention, a method for manufacturing a capacitor for a semiconductor device is taught. The method comprises forming a first interlayer dielectric film pattern on a semiconductor substrate, with the interlayer dielectric film pattern having a first contact hole to expose a portion of the semiconductor substrate through the first contact hole. A contact plug is formed to fill the first contact hole and connect to the semiconductor substrate. A diffusion barrier layer pattern is formed on the contact plug, and a first conductive film pattern is formed on the diffusion layer pattern. Next a second interlayer dielectric film pattern is formed on the first dielectric film pattern and the first conductive film pattern. The second interlayer dielectric film pattern includes a second contact hole that exposes a top surface of the first conductive film pattern. A second conductive film pattern is formed on the first conductive film pattern which is exposed through the second contact hole. A dielectric film is formed on the second conductive film pattern and a third conductive film is formed on the dielectric film.

BRIEF DESCRIPTION OF THE DRAWINGS

The above objects and advantages of the present invention will become more apparent by describing in detail specific embodiments thereof with reference to the attached drawings in which.

DESCRIPTION OF THE PREFERRED EMBODIMENTS

Figure 1:
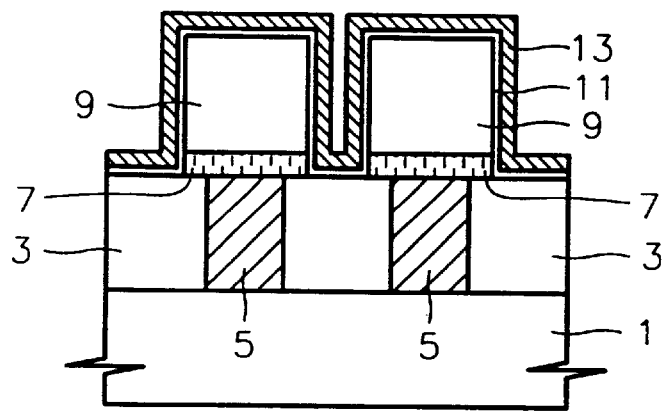
FIG. 1 is a sectional view of a capacitor of a semiconductor device according to a conventional technology.
Figure 2:
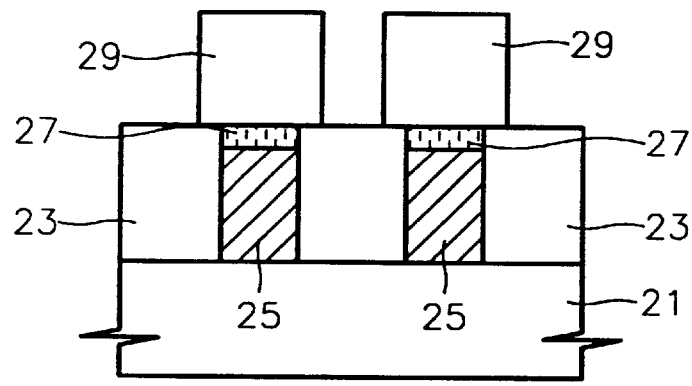
FIGS. 2 and 3 are sectional views of capacitors of semiconductor devices according to another conventional technology.
Figure 3:
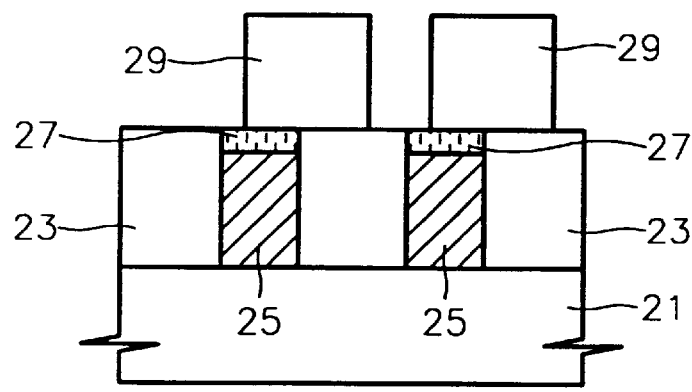
Figure 4:
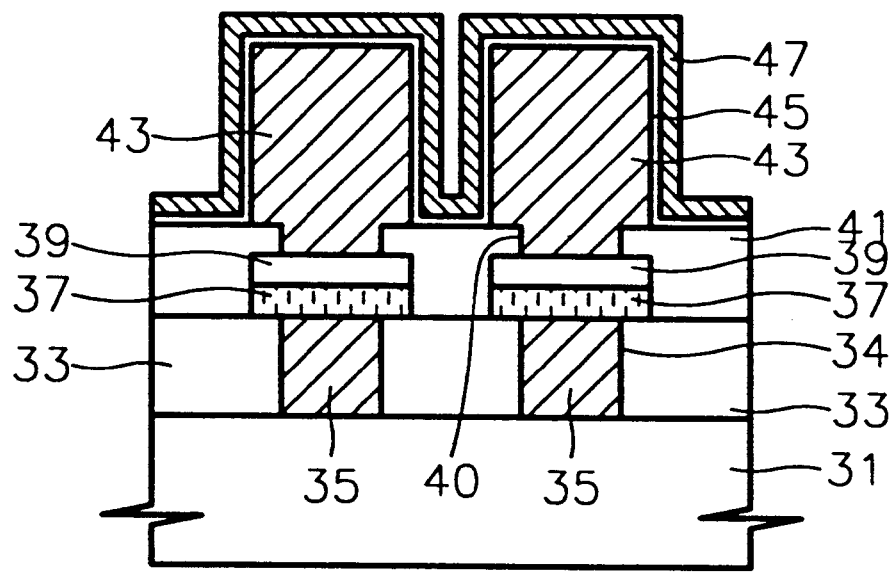
FIG. 4 is a sectional view of a capacitor of a semiconductor device according to an embodiment of the present invention.

FIG. 4 is a sectional view of a capacitor of a semiconductor device according to an embodiment of the present invention.

To be specific, a first interlayer dielectric film pattern 33 having a first contact hole 34 therethrough is formed on a semiconductor substrate 31, for example, a silicon substrate. A contact plug 35 electrically connected to the semiconductor substrate 31 is formed in the first contact hole 34. The contact plug 35 is comprised of a polysilicon film, a silicon film, a tungsten film, a tungsten nitride film, or a titaninum nitride film. A diffusion barrier layer pattern 37 and a first conductive film pattern 39 are sequentially formed on the contact plug 35 and the first interlayer dielectric film pattern 33 so as to be connected to the contact plug 35. The first conductive film pattern 39 is formed to prevent the diffusion barrier layer pattern 37 from being oxidized. The diffusion barrier layer pattern 37 is formed of Ta, Ti, W, Co, Ir, Ru, TaSi, CoSi, $TiSi_x$, WSi, TiSiN, TaSiN, $IrO_2$, $RuO_2$, WN, TiN, TaN, TaAlN, or TaAlN. The first conductive film pattern 39 is comprised of a platinum group metal such as Pt, Ru, or Ir, a platinum group oxide such as $IrO_2$ or $RuO_2$, or a conductive oxide including the platinum group metal and having a perovskite structure, such as $SrRuO_3$, $CaSrRuO_3$, or $BaSrRuO_3$.

A second interlayer dielectric film pattern 41 having a second contact hole 40 for exposing the surface of the first conductive film pattern 39 is formed on the first interlayer dielectric film pattern 33 and the first conductive film pattern 39. A second conductive film pattern 43 used as the lower electrode of the capacitor is formed to be buried in the second contact hole 40 and connected to the first conductive film pattern 39. A high dielectric film 45 is formed on the second conductive film pattern 43. The high dielectric film 45 is comprised of $Al_2O_3$, $Ta_2O_5$, (Ba, Sr) $TiO_3$, $BaTiO_3$, $SrTiO_3$, $PbTiO_3$, Pb(Zr, Ti)$O_3$, (Pb, La)$TiO_3$, $KNO_3$, or $LiNbO_3$. A third conductive film pattern 47 used as the upper electrode of the capacitor is formed on the high dielectric film 45. The second conductive film pattern 43 and the third conductive film pattern 47 are comprised of a platinum group metal such as Pt, Ru, and Ir, a platinum group oxide conductor such as $IrO_2$ and $RuO_2$, or an oxide conductor including the platinum group metal and having a perovskite structure, such as $SrRuO_3$, $CaSrRuO_3$, and $BaSrRuO_3$, respectively.

In particular, since the diffusion barrier layer pattern 37 is buried under the first conductive film pattern 39 in the capacitor of the semiconductor device according to the present invention shown in FIG. 4, it is not exposed during the formation of the high dielectric film 45 and the subsequent heat treatment.

Furthermore, in the capacitor of the semiconductor device according to the present invention shown in FIG. 4 it is possible to control the diffusion path of oxygen atoms by controlling the height (the thickness) of the first conductive film pattern 39 formed on the diffusion barrier layer pattern 37. Therefore, it is not required to increase the height (the thickness) of the second contact hole 40 formed in the second interlayer dielectric film pattern 41. In this case, in a highly integrated semiconductor device, it is possible to form the second conductive film such as the platinum group metal and the oxide thereof in the second contact hole 40 not by a CVD (chemical vapor deposition) method which has a high process cost and is not well developed but by a sputtering method. As a result, the capacitor of the semiconductor device according to the present invention prevents the oxidization of the diffusion barrier layer pattern 37 and reduces a contact resistance.

Figure 5:
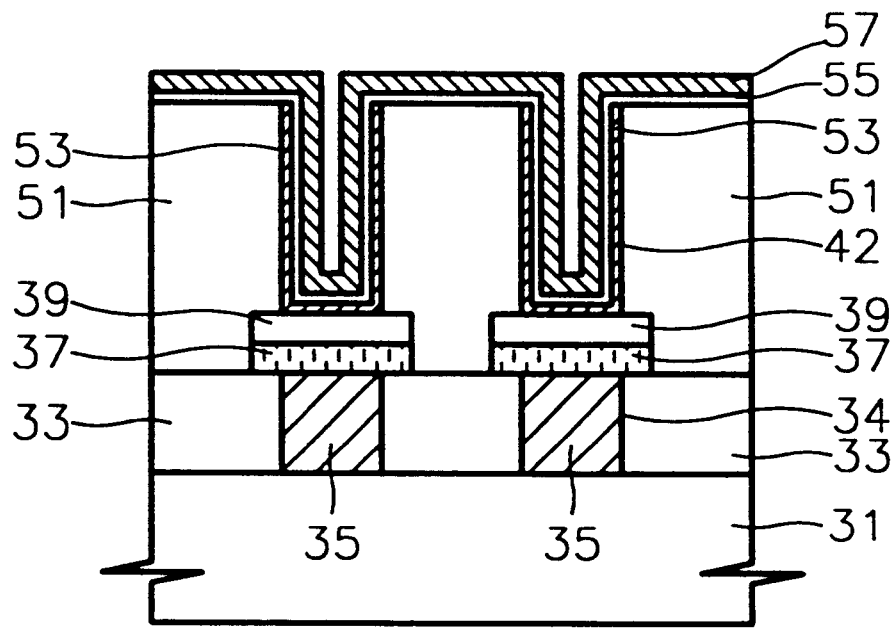
FIG. 5 is a sectional view of a capacitor of a semiconductor device according to another embodiment of the present invention.

FIG. 5 is a sectional view of a capacitor of a semiconductor device according to a second embodiment of the present invention. In FIG. 5, reference numerals identical to those of FIG. 4 denote identical members.

To be specific, in the capacitor of the semiconductor device according to the second embodiment of the present invention, as shown in FIG. 4, the first interlayer dielectric film pattern 33 having a first contact hole 34, a contact plug 35 buried in the first contact hole 43, the diffusion barrier layer pattern 37, and the first conductive film pattern 39 are formed on the semiconductor substrate 31. The height (the thickness) of a second interlayer dielectric film pattern 51 having the second contact hole 42 exposing the first conductive film pattern 39 is formed to be high. The second conductive film pattern 53 used as the lower electrode of the capacitor is formed on the inner wall of the second contact hole 42 and on the first conductive film pattern 39. A high dielectric film 55 and a third conductive film pattern 57 used as the upper electrode are formed on the second conductive film pattern 53. The second conductive film pattern 53 and the third conductive film pattern 57 are comprised of a platinum group metal such as Pt, Ru, or Ir, a conductive platinum group oxide such as $IrO_2$ or $RuO_2$, or a conductive oxide including the platinum group metal and having a perovskite structure, such as $SrRuO_3$, $CaSrRuO_3$, or $BaSrRuO_3$. A high dielectric film 55 is comprised of $Al_2O_3$, $Ta_2O_5$, (Ba, Sr) $TiO_3$, $BaTiO_3$, $SrTiO_3$, $PbTiO_3$, Pb(Zr, Ti)$O_3$, (Pb, La)$TiO_3$, $KNO_3$, or $LiNbO_3$.

In particular, in the capacitor of the semiconductor device according to the embodiment of the present invention shown in FIG. 5, the diffusion barrier layer pattern 37 is not exposed during the formation of the high dielectric film 45 and the subsequent process of heat treatment since it is buried under the first conductive film pattern 39 like in FIG. 4, and an oxygen diffusion path is long due to the first conductive film pattern 39.

In the capacitor of the semiconductor device according to the second embodiment of the present invention shown in FIG. 5, the second interlayer dielectric film pattern 51 is higher than that of FIG. 4. The second conductive film pattern 53 used as the lower electrode is not formed by a dry etching process but by a CMP (chemical mechanical polishing) method or an etch back method. When the second conductive film pattern 43 (FIG. 4) used as the lower electrode comprised of the platinum group metal or the oxide thereof becomes higher since the semiconductor device is highly integrated, it is not possible to form the second conductive film pattern having a height of at least 300 nm under 0.3 um pitch.

FIGS. 6 through 10 are sectional views of a semiconductor device for describing a method for manufacturing a capacitor of the semiconductor device according to the present invention shown in FIG. 4.

Figure 6:
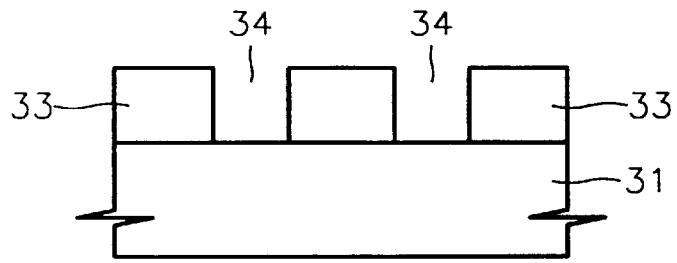
FIGS. 6 through 10 are sectional views of a semiconductor device for describing a method for manufacturing a capacitor of a semiconductor device according to the present invention shown in FIG. 4.

In FIG. 6, the first interlayer dielectric film pattern 33 having the first contact hole 34 is formed by forming an insulating film on the semiconductor substrate 31, for example, the silicon substrate, and patterning it.

Figure 7:
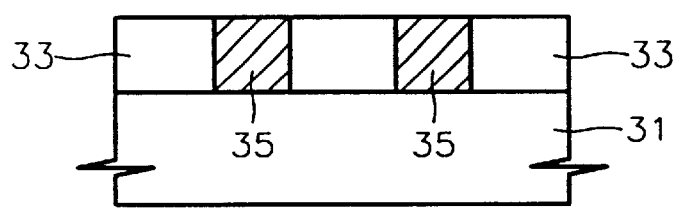

In FIG. 7, after forming a conductive film for the contact plug 35 on the substrate 31 on which the first contact hole 34 and the first interlayer dielectric film pattern 33 are formed, the inside of the first contact hole 34 is buried by etching back or performing CMP (Chemical Mechanical Polishing) on the conductive film, and thus the contact plug 35 electrically connected to the semiconductor substrate 31 is formed. The contact plug 35 is formed of a polysilicon film, a silicon film, a tungsten film, a tungsten nitride film, or a titanium nitride film. An ohmic layer may be further formed on the contact plug in order to reduce resistance. A metal film having a high melting point such as Co and Ta, a metal nitride film, or a TiW film can be used as the ohmic layer.

Figure 8:
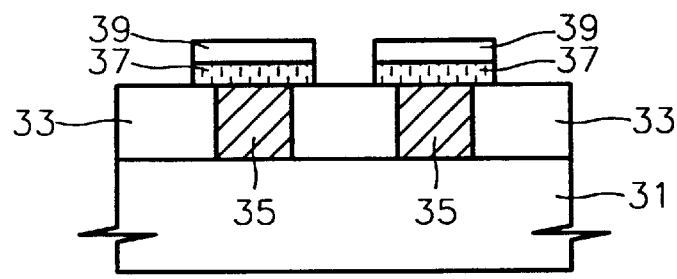

In FIG. 8, the diffusion barrier layer pattern 37 and the first conductive film pattern 39 are formed on the contact plug 35 by sequentially forming a diffusion barrier layer and a conductive film to have thicknesses of 300 to 500 Å and 500 to 1,500 Å on the overall surface of the resultant on which the contact plug film 35 is formed and patterning the diffusion barrier layer and the conductive film using a photolithography and etching processes. The diffusion barrier layer pattern 37 is formed of one selected from the group consisting of Ta, Ti, W, Co, Ir, Ru, TaSi, CoSi, $TiSi_x$, WSi, TiSiN, TaSiN, $IrO_2$, $RuO_2$, WN, TiN, TaN, TaAlN, and TiAlN. The first conductive film pattern 39 is comprised of a platinum group metal such as Pt, Ru, or Ir, a conductive platinum group oxide such as $IrO_2$ or $RuO_2$, or a contuctive oxide including the group and a perovskite structure such as $SrRuO_3$, $CaSrRuO_3$, or $BaSrRuO_3$.

Figure 9:
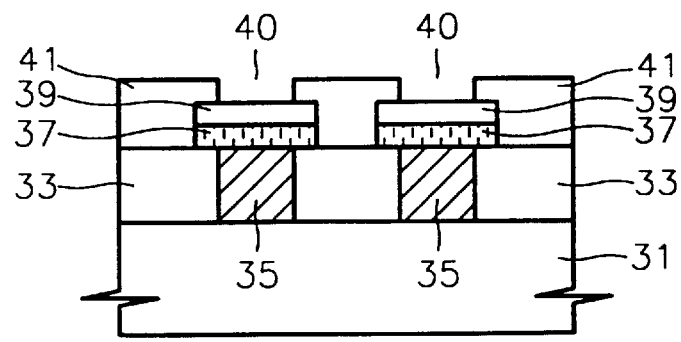

In FIG. 9, a second interlayer dielectric film pattern 41 having a second contact hole 40 exposing the surface of the first conductive film pattern 39 is formed by forming an insulating film on the overall surface of the substrate 31 so as to fill a space between the diffusion barrier layer pattern 37 and the first conductive film pattern 39 using a chemical vapor deposition (CVD) method, an LPCVD (low pressure CVD) method, or a PECVD (plasma enhanced CVD) method and patterning the insulating film. The second interlayer dielectric film pattern 41 is formed of undoped silicate glass (USG), spin on glass (SOG), or boro phospho silicate glass (BPSG).

Figure 10:
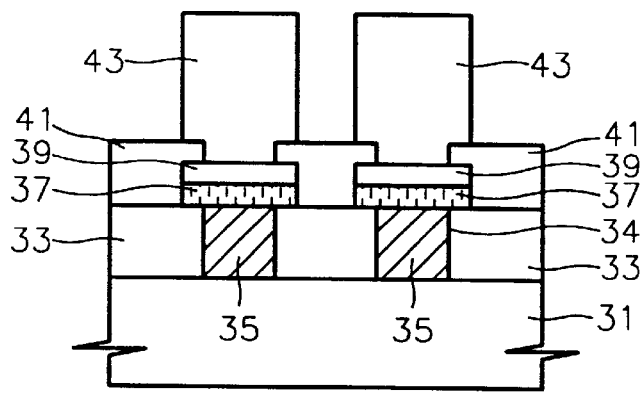

In FIG. 10, a second conductive film pattern 43 used as the lower electrode of the capacitor is formed on the first conductive film pattern 39 by forming a conductive film on the overall surface of the substrate 31, on which the first conductive film pattern 39 and the second interlayer dielectric film pattern 41 are formed, to have a thickness of 3,000 to 7,000 Å and patterning the conductive film. The second conductive film pattern 43 is comprised of a platinum group metal suck as Pt, Ru, or Ir, a conductive platinum group oxide such as $IrO_2$ or $RuO_2$, or including the platinum group metal and having a perovskite structure such as $SrRuO_3$, $CaSrRuO_3$, or $BaSrRuO_3$.

As shown in FIG. 4, a high dielectric film 45 is formed on the overall surface of the substrate 31 on which the second conductive film pattern 43 is formed. The high dielectric film 45 is formed of $Al_2O_3$, $Ta_2O_5$, (Ba, Sr) $TiO_3$, $BaTiO_3$, $SrTiO_3$, $PbTiO_3$, $PbTiO_3$, $Pb(Zr, Ti)O_3$, (Pb, La)$TiO_3$, $KNO_3$, or $LiNbO_3$. The high dielectric film 45 is formed by a sputtering method or a CVD method. The capacitor of the semiconductor device is completed by forming a third conductive film pattern 47 used as the upper electrode of the capacitor on the high dielectric film 45. The third conductive film pattern 47 is comprised of a platinum group metal such as Pt, Ru, or Ir, a conductive platinum group oxide such as $IrO_2$ or $RuO_2$, a conductive oxide including the platinum group metal and having a perovskite structure such as $SrRuO_3$, $CaSrRuO_3$, or $BaSrRuO_3$, or a metal having a high melting point such as W or TiN.

Figure 11:
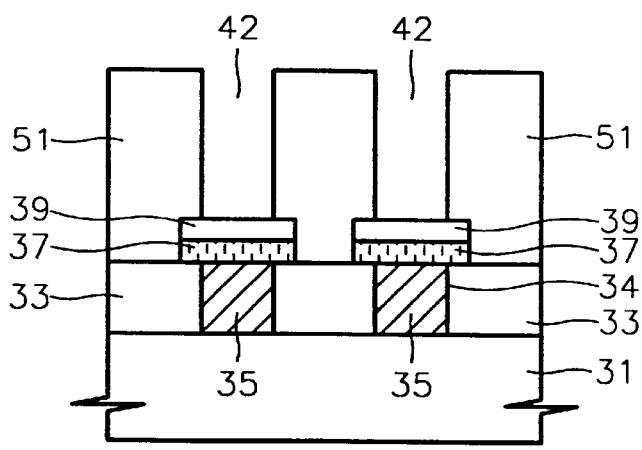
FIGS. 11 through 13 are sectional views of a semiconductor device for describing a method for manufacturing the capacitor of the semiconductor device according to the present invention shown in FIG 5.
Figure 12:
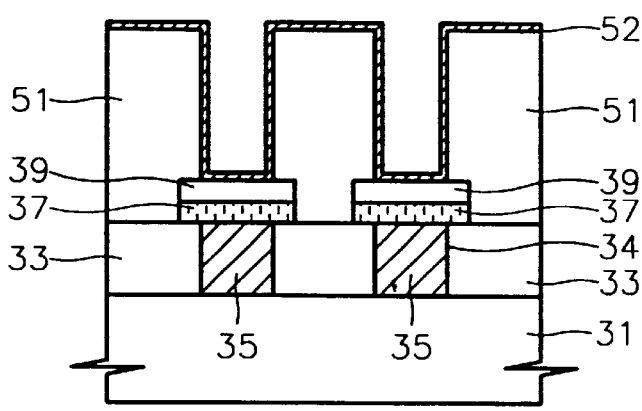
Figure 13:
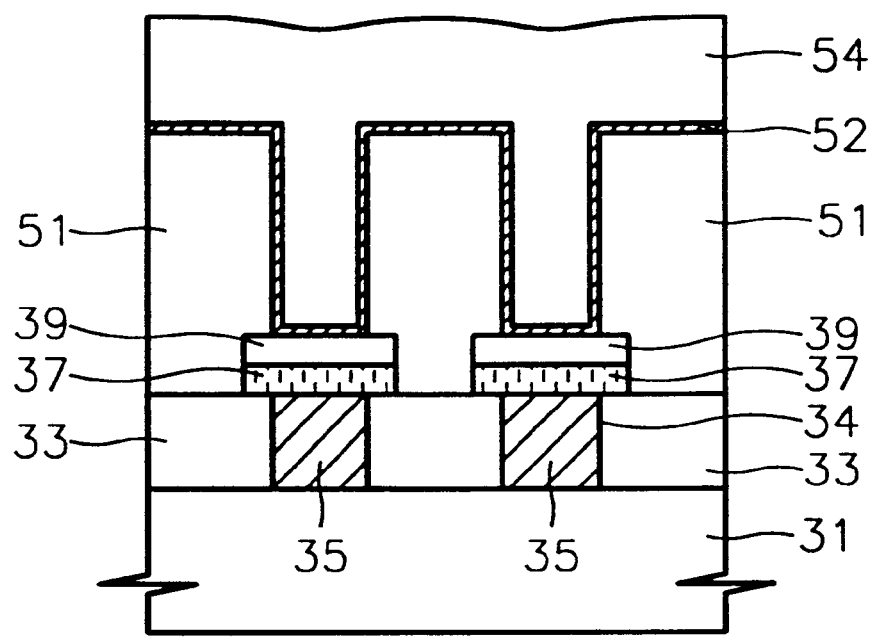

FIGS. 11 through 13 are sectional views of a semiconductor device for describing an example of a method for manufacturing the capacitor of the semiconductor device according to the present invention shown FIG. 5.

To be specific, manufacturing processes described with reference to FIGS. 6 through 8 are proceeded. By doing so, the first interlayer dielectric film pattern 33, the contact plug 35, the diffusion barrier layer pattern 37 and the first conductive film pattern 39 are formed on the semiconductor substrate 31 as shown in FIG 8.

Referring to FIG. 11, a second interlayer dielectric film pattern 51 having the second contact hole 42 exposing he first conductive film pattern 39 is formed by forming an insulating film on the overall surface of the substrate 31 on which the first conductive film pattern 39 is formed and patterning the insulating film. The second interlayer dielectric film pattern 51 is formed to be thicker than the second interlayer dielectric film pattern 41 shown in FIG. 9.

Referring to FIG. 12, a second conductive film 52 used as the lower electrode of the capacitor is formed to have a thickness of 50 to 500 Å on the overall surface of the substrate 31 on which the second interlayer dielectric film pattern 51 is formed. The second conductive film 52 is comprised of a platinum group metal such as Pt, Ru, or Ir, a conductive platinum group oxide such as$IrO_2$ or $RuO_2$, an oxide conductor including the platinum group metal and having a perovskite structure such as $SrRuO_3$, $CaSrRuO_3$, or $BaSrRuO_3$ or a metal having a high melting point such as W or TiN.

Referring to FIG. 13, a material film 54 filling the second contact hole 42 and formed of a photoresist film or an insulating film is formed on the overall surface of the substrate 31 on which the second conductive film 52 is formed.

Figure 14:
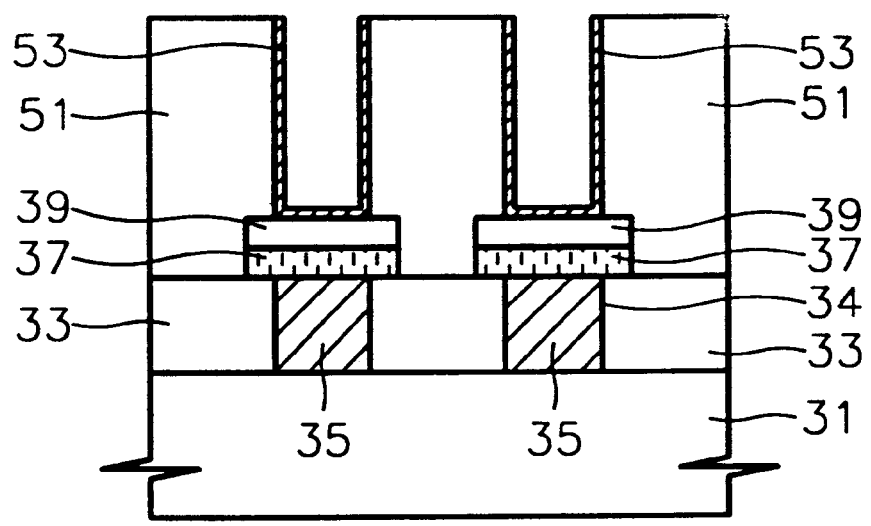

Referring to FIG. 14, a second conductive film pattern 53 is formed by etching back or performing a CMP method on the material film 54 and the second conductive film 52 until the second interlayer dielectric film pattern 51 is exposed. Then, the material film 54 left in the second contact hole 42 is removed. By doing so, the second conductive film pattern 53 used as the lower electrode of the capacitor is formed on the inner wall of the second contact hole and on the first conductive film pattern 39.

When the second conductive film pattern 53 is formed by the CMP method, the material film 54 may not be used. Namely, when the CMP process is performed on the second conductive film 52 without forming the material film, the second conductive film pattern used as the lower electrode of the capacitor is formed on the inner wall of the second contact hole and on the first conductive film pattern 39.

As shown in FIG. 5, a high dielectric film 55 and a third conductive film pattern 57 used as the upper electrode 57 are formed on the second conductive film pattern 53. The high dielectric film 55 is formed of $Al_2O_3$, $Ta_2O_5$, (Ba, Sr) $TiO_3$, $BaTiO_3$, $SrTiO_3$, $PbTiO_3$, $PbTiO_3$, $Pb(Zr, Ti)O_3$, (Pb, La)$TiO_3$, $KNO_3$, or $LiNbO_3$. The third conductive film pattern 57 is comprised of a platinum group metal such as Pt, Ru, or Ir, a conductive platinum group oxide such as $IrO_2$ or $RuO_2$, a conductive oxide including the platinum group metal and having a perovskite structure such $SrRuO_3$, $CaSrRuO_3$, or $BaSrRuO_3$ or a metal having a high melting point such as W or TiN.

According to the present invention, it is possible to prevent an increase of the contact resistance since the first conductive film pattern prevents the diffusion barrier layer pattern from oxidizing when the high dielectric film is used as the dielectric film of the capacitor.

The present invention is not restricted to the above embodiments, and it is clearly understood that many variations are possible within the scope and spirit of the present invention by anyone skilled in the art.

What is claimed is:

1. A method for manufacturing a capacitor of a semiconductor device, comprising:

forming a first interlayer dielectric film pattern on a semiconductor substrate, wherein the first interlayer dielectric film pattern comprises a first contact hole, so that a portion of the semiconductor substrate is exposed through the first contact hole;

forming a contact plug which fills the first contact hole and connects to the semiconductor substrate;

forming a diffusion barrier layer pattern on the contact plug;

forming a first conductive film pattern on the diffusion barrier layer pattern;

forming a second interlayer dielectric film pattern on the first interlayer dielectric film pattern and the first film pattern, wherein the second interlayer dielectric film pattern comprises a second contact hole that exposes a top surface of the first conductive film pattern;

forming a second conductive film pattern on the first conductive film pattern exposed through the second contact hole;

forming a dielectric film on the second conductive film pattern; and forming a third conductive film on the dielectric film.

2. The method of claim 1, wherein forming the contact plug comprises:

forming a conductive film which fills the first contact hole and covers the first interlayer dielectric film pattern; and removing upper portions of the conductive film until the first dielectric film pattern is exposed.

3. The method of claim 1, wherein the diffusion barrier layer pattern is formed of a material selected from a group consisting of Ta, Ti, W, Co, Ir, Ru, TaSi, CoSi, $TiSi_x$, WSi, TiSiN, TaSiN, $IrO_2$, $RuO_2$, WN, TiN, TaN, TaAlN, and TiAlN.

4. The method of claim 1, wherein the first conductive film pattern is formed of a material selected from a group consisting of a platinum group metal and conductive oxides of the platinum group metal.

5. The method of claim 1, wherein forming the second conductive film pattern comprises:

forming a conductive film on the first conductive film pattern exposed through the second contact hole on at least some of the inner walls of the second contact hole and the second interlayer dielectric film pattern;

forming a material film on the conductive film such that the material film fills the second contact hole;

removing portions of the material film and the conductive film to expose the second interlayer dielectric film pattern; and removing the material film in the second contact hole.

6. The method of claim 5, wherein the material film comprises an insulating film.

7. The method of claim 1, wherein forming the second conductive film pattern comprises:

forming a conductive film on the first conductive film pattern exposed through the second contact hole on at least some of the inner walls of the second contact hole and the second interlayer dielectric film pattern; and removing portions of the conductive film to expose the second interlayer dielectric film pattern.

8. The method of claim 1, further comprising forming an ohmic layer on the contact plug prior to said forming of the diffusion barrier layer pattern.

9. The method of claim 8, wherein the ohmic layer is formed of at least one film selected from a group consisting of a metal film, a metal nitride film and a TiW film.

10. A method for manufacturing a capacitor of a semiconductor device, comprising:

forming a first insulating layer on a semiconductor substrate, wherein the first insulating layer comprises a first contact hole that exposes the semiconductor substrate in the first contact hole;

forming a contact plug which substantially fills the first contact hole;

forming a barrier layer on the contact plug;

forming a first conductive layer on the barrier layer;

forming a second insulating layer on the first insulating layer and the first conductive layer, wherein the second insulating layer comprises a second contact hole that exposes the first conductive layer;

forming a first electrode on the first conductive layer within at least a portion of the second contact hole; and forming a dielectric film on the first electrode; and forming a second electrode on the dielectric film.

11. The method of claim 10, wherein forming the first electrode comprises forming a second conductive layer on the first conductive layer within the second contact hole.

12. The method of claim 10, wherein the first conductive layer has a depth of between approximately 500 and 1,500 Angstroms.

13. The method of claim 12, wherein the barrier layer has a depth of between approximately 300 and 500 Angstroms.

14. The method of claim 10, wherein the first conductive layer and the second insulating layer have a combined depth of between approximately 3,000 and 7,000 Angstroms.

15. The method of claim 10, wherein the first conductive layer is formed of a material selected from a group consisting of a platinum group metal and conductive oxides of a platinum group metal.

16. The method of claim 10, wherein the barrier layer comprises a diffusion barrier layer.

* * * * *